(12) United States Patent
Galor Gluskin et al.

(10) Patent No.: US 9,420,164 B1
(45) Date of Patent: Aug. 16, 2016

(54) PHASE DETECTION AUTOFOCUS NOISE REDUCTION

(71) Applicant: QUALCOMM Incorporated, San Diego, CA (US)

(72) Inventors: Micha Galor Gluskin, San Diego, CA (US); Ruben Manuel Velarde, Chula Vista, CA (US); Jisoo Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/865,503

(22) Filed: Sep. 25, 2015

(51) Int. Cl.
H04N 5/232 (2006.01)

(52) U.S. Cl.
CPC ............... *H04N 5/23212* (2013.01)

(58) Field of Classification Search
CPC .................................................. H04N 5/23212
See application file for complete search history.

(56) References Cited

U.S. PATENT DOCUMENTS

| 9,288,384 | B2 * | 3/2016 | Aoki .................... G02B 7/34 |
| 2007/0237429 | A1 | 10/2007 | Kusaka |
| 2007/0237512 | A1 | 10/2007 | Kusaka |
| 2013/0002911 | A1 | 1/2013 | Miyashita et al. |
| 2013/0002936 | A1 | 1/2013 | Hirama et al. |
| 2014/0028806 | A1 | 1/2014 | Endo |
| 2014/0168483 | A1 | 6/2014 | Aoki et al. |
| 2014/0232913 | A1 | 8/2014 | Sakane |
| 2014/0247385 | A1 | 9/2014 | Yamasaki |
| 2014/0267839 | A1 | 9/2014 | Nishimaki et al. |
| 2015/0062400 | A1 | 3/2015 | Kawai et al. |
| 2015/0156400 | A1 | 6/2015 | Seo |
| 2015/0381951 | A1 * | 12/2015 | Mlinar ..................... H04N 9/04 348/223.1 |
| 2016/0042526 | A1 * | 2/2016 | Lee .................... H04N 5/23212 348/351 |
| 2016/0044230 | A1 * | 2/2016 | Yoshimura ............. H04N 9/646 348/353 |

FOREIGN PATENT DOCUMENTS

| JP | 2011007882 A | 1/2011 |
| JP | 2011033975 A | 2/2011 |
| JP | 2011176714 A | 9/2011 |

* cited by examiner

*Primary Examiner* — William Perkey
(74) *Attorney, Agent, or Firm* — Knobbe, Martens, Olson & Bear LLP

(57) ABSTRACT

Certain aspects relate to systems and techniques for using imaging pixels (that is, non-phase detection pixels) for performing noise reduction on phase detection autofocus. Advantageously, this can provide for more accurate phase detection autofocus and also to optimized processor usage for performing phase detection. The phase difference detection pixels are provided to obtain a phase difference detection signal indicating a shift direction (defocus direction) and a shift amount (defocus amount) of image focus, and analysis of imaging pixel values can be used to estimate a level of focus of an in-focus region of interest and to limit the identified phase difference accordingly.

30 Claims, 9 Drawing Sheets

PHASE DETECTION AUTOFOCUS NOISE REDUCTION

CROSS-REFERENCE TO RELATED APPLICATIONS

The present application is related to U.S. patent application Ser. No. 14/864,153, filed on Sep. 24, 2015, entitled "MASKLESS PHASE DETECTION AUTOFOCUS" and U.S. patent application Ser. No. 14/865,629, filed on Sep. 25, 2015, entitled "PHASE DETECTION AUTOFOCUS ARITHMETIC," the contents of which are hereby incorporated by reference herein.

TECHNICAL FIELD

The systems and methods disclosed herein are directed to phase detection autofocus, and, more particularly, to analyzing imaging pixels to reduce noise in the phase detection autofocus process.

BACKGROUND

Some image capture devices use phase difference detection sensors (which may also be referred to as "pixels") to perform autofocus. On-sensor phase difference detection works by interspersing phase difference detection pixels between imaging pixels, typically arranged in repeating sparse patterns of left and right pixels. The system detects phase differences between signals generated by different phase difference detection pixels, for example between an image generated from left pixel data and an image generated from right pixel data. The detected phase differences can be used to perform autofocus.

Phase detection autofocus operates faster than contrast-based autofocus. Many current implementations place a metal mask over the image sensor to create left and right phase detection pixels, resulting in less light reaching the masked pixels. Because the output of phase detection pixels has lower brightness than the output of normal image capturing pixels, the phase difference detection pixels create noticeable artifacts in captured images that require correction. By placing the phase detection pixels individually amidst imaging pixels, the system can interpolate values for the phase detection pixels.

Masked pixels are used in pairs. When the scene is out of focus, the phase detection pixel mask phase shifts the incoming light slightly. The distance between phase detection pixels, combined with their relative shifts, can be convolved to give a determination of roughly how far the optical assembly needs to move the lens to bring the scene into focus.

SUMMARY

In signal processing, noise is generally refers to unwanted and possibly unknown modifications or errors that a signal may suffer during capture, storage, transmission, processing, or conversion. More specifically, in autofocus contexts, noise can refer to inaccurate determinations of focus conditions. In some phase detection autofocus systems, for example with sparsely positioned phase detection pixels (for example, having five or more imaging pixels located between phase detection pixels in a pair), target scenes with high frequency patterns may cause the autofocus system to falsely identify a defocus condition with the target scene is actually in focus. In signal processing, this phenomena, which occurs when a high frequency signal is sampled at a low frequency, is also referred to as aliasing or aliasing noise.

The aforementioned problems, among others, are addressed in some embodiments by the phase detection autofocus systems and techniques described herein that use values received from imaging pixels to reduce noise of the autofocus process. For example, values from imaging pixels can be analyzed to provide information about high frequency details in the target scene and to identify a sharpest edge in the image data of the target scene. The phase detection process can be limited to a specific range of possible defocus conditions based on a sharpness metric of the sharpest edge. As a result, processing time and resources for performing autofocus can be optimized. Further, any identified defocus condition may not exceed a largest defocus possible for producing the sharpest edge.

One innovation includes an imaging apparatus including a plurality of diodes each configured to capture one of image information representing a target scene, the image information received from a first subset of the plurality of diodes, or phase detection information, the phase detection information received from a second subset of the plurality of diodes; and a processor configured with instructions to analyze the image information identify a region of the image information that is more in-focus than another region of the image information, and determine a focus value of the region, identify a bounding phase difference value corresponding to the focus value, generate at least first and second images based on the phase detection information, and determine a phase difference between the first and second images, and calculate an autofocus adjustment based at least partly on the determined phase difference and at least partly on a range defined by the bounding phase difference value.

The following are non-limiting examples of some features and embodiments of such imaging apparatuses. For example, the processor can be configured to determine the focus value by identifying a sharpest edge represented by the image information. The processor can be configured to determine the focus value based at least partly on a sharpness value of the sharpest edge. The imaging apparatus can further include a masking element positioned above each of the second subset of the plurality of diodes to block a portion of light propagating from the target scene so each of the second subset of the plurality of diodes only collects the light propagating from the target scene in a specific direction. The imaging apparatus can further include a microlens positioned above at least two adjacent diodes of the second subset of the plurality of diodes, the microlens formed to pass a first portion of light propagating from the target scene to a first of the at least two adjacent diodes and a second portion of light propagating from the target scene to a second of the at least two adjacent diodes, the first portion propagating in a first direction and the second portion propagating in a second direction. The plurality of diodes can be a semiconductor substrate having a two-dimensional matrix of the plurality of diodes. Optical elements associated with a first half of the second subset of the plurality of diodes can be configured such that each diode of the first half of the second subset of the plurality of diodes only collects light propagating from the target scene in a first direction to generate a first half of the phase detection information. Optical elements associated with a second half of the second subset of the plurality of diodes can be configured such that each diode of the second half of the second subset of the plurality of diodes only collects light propagating from the target scene in a second direction to generate a second half of the phase detection information.

Another innovation includes a processor configured with instructions for performing a process for phase detection autofocus, the process including accessing image information representing a target scene from a first plurality of imaging diodes; analyzing the image information to evaluate a focus value of at least one region; identifying a bounding phase difference value corresponding to the focus value; generating at least first and second images based on phase detection information accessed from a second plurality of imaging diodes; determining a phase difference between the first and second images; and calculating an autofocus adjustment based at least partly on the determined phase difference and at least partly on a range defined by the bounding phase difference value.

The following are non-limiting examples of some features and embodiments of such processors. For example, identifying the bounding phase difference value can include determining whether the determined phase difference value falls within a range defined by the bounding phase difference value; and in response to determining that the determined phase difference value exceeds the range, outputting the bounding phase difference value as a phase difference between the first and second images. Outputting the bounding phase difference value as a phase difference can be further performed in response to determining that the process for phase detection autofocus is in a monitoring state. The monitoring state can occur after the process for phase detection autofocus has identified an in-focus condition and moved a lens assembly associated with the plurality of imaging sensing elements and the at least one phase detection sensing element to a focus position corresponding to the in-focus condition. Identifying the phase difference can include analyzing the phase difference information within a range defined by the bounding phase difference value. The process can further include partitioning the image information into a plurality of regions and analyzing the plurality of regions to evaluate a plurality of focus values each corresponding to one of the plurality of regions. The process can further include identifying a plurality of bounding phase differences value each based on one of the plurality of focus values. The process can further include combining the plurality of bounding phase difference values to produce the bounding phase difference value used for calculating the autofocus adjustment. The process can further include selecting one of the plurality of bounding phase difference values of at least some of the plurality of regions to output as the bounding phase difference value used for calculating the autofocus adjustment.

Another innovation includes a process for phase detection autofocus including accessing image information from a plurality of imaging diodes, the image information representing a target scene; accessing phase detection information received from a plurality of phase detection diodes; determining, based on the image information, information representing at least one depth discontinuity in the target scene; identifying a pair of the plurality of phase detection diodes located on opposing sides of the at least one depth discontinuity; and calculating an autofocus adjustment based on phase detection information received from a subset of the plurality of phase detection diodes excluding the pair.

The following are non-limiting examples of some features and embodiments of such processes. For example, determining the information representing the at least one depth discontinuity in the target scene can include interpolating, from the image information, a first center pixel value at a location of a first phase detection diode in the pair and a second center pixel value at a location of a second phase detection diode in the pair; calculating a first disparity value between the first center pixel value and a value received from the first phase detection diode; calculating a second disparity value between the second center pixel value and a value received from the second phase detection diode; and comparing a difference between the first disparity and the second disparity to a threshold. The process can further include excluding the pair from the subset of the plurality of phase detection diodes in response to determining that the difference is greater than the threshold. Interpolating the first center pixel value can further include accessing image information received from a 5×5 neighborhood of the plurality of imaging diodes around a location of the first phase detection diode. The process can further include computing the difference between the first disparity and the second disparity. Determining the information representing the at least one depth discontinuity in the target scene can include performing edge detection on the image information. Calculating an autofocus adjustment can include using phase detection information received from the subset of the plurality of phase detection diodes to generate a pair of half-images; determining a phase difference between the half-images; and calculating the autofocus adjustment based on the phase difference.

Another innovation includes an imaging apparatus including means for capturing image information representing a target scene; a plurality of means for capturing phase detection information; means for identifying a region of the image information that is more in-focus than another region of the image information and determining a focus value of the region; means for identifying a bounding phase difference value corresponding to the focus value; means for generating at least first and second images based on the phase detection information; means for determining a phase difference between the first and second images, and means for calculating an autofocus adjustment based at least partly on the determined phase difference and at least partly on a range defined by the bounding phase difference value.

The following are non-limiting examples of some features and embodiments of such imaging apparatuses. For example, the imaging apparatus can further include means for partitioning the image information into a plurality of regions, wherein the means for identifying the bounding phase difference value can be configured to identify a plurality of bounding phase difference values each corresponding to one of the plurality of regions. The imaging apparatus can further include means for combining the plurality of bounding phase difference values of at least some of the plurality of regions to produce the bounding phase difference value used for calculating the autofocus adjustment. The imaging apparatus can further include means for selecting one of the plurality of bounding phase difference values of at least some of the plurality of regions to output as the bounding phase difference value used for calculating the autofocus adjustment. The means for generating at least first and second images based on the phase detection information can include an image sensor including logic. The means for generating at least first and second images based on the phase detection information can include an image signal processor.

BRIEF DESCRIPTION OF THE DRAWINGS

The disclosed aspects will hereinafter be described in conjunction with the appended drawings and appendices, provided to illustrate and not to limit the disclosed aspects, wherein like designations denote like elements.

DETAILED DESCRIPTION

Introduction

Figure 1A:
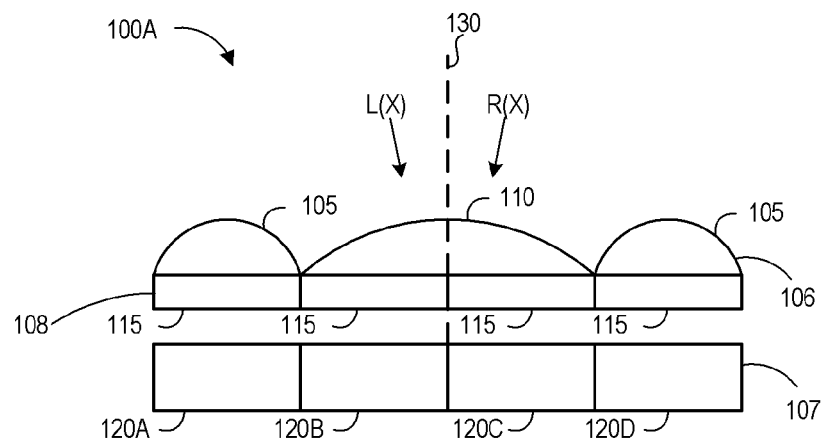
FIG. 1A depicts a schematic view of an example multi-diode microlens for obtaining phase detection autofocus information.

Embodiments of the disclosure relate to systems and techniques for using imaging pixels (that is, non-phase detection pixels) for performing noise reduction on phase detection autofocus. Advantageously, this can provide for more accurate phase detection autofocus and also to optimized processor usage for performing phase detection. The phase difference detection pixels are provided to obtain a phase difference detection signal indicating a shift direction (defocus direction) and a shift amount (defocus amount) of image focus, and analysis of imaging pixel values can be used to estimate a level of focus of an in-focus region of interest and to limit the identified phase difference accordingly.

Image data received from imaging pixels can be used, for example, to exclude incorrect phase difference calculations based on calculating a maximum allowable phase difference value from analysis of the image data. If the region of neighboring pixels around a particular phase detection pixel shows strong or sharp edges, for example based on a contrast analysis, this can indicate that the image is close to the focus point. Accordingly, the noise reduction method may bound the maximum possible phase difference value that can be identified by the phase detection pixels. This maximum may be used to omit wrong phase detection calculations, for example, phase differences that exceed the calculated maximum. The maximum can also be used to optimize the phase detection algorithm so that it will not need to perform a full phase detection search. In one example the range of phase detection searching can be limited based on the maximum possible phase difference. In another example, the autofocus system can directly report the image to be in focus (for example, by reporting a PD phase equal to 0).

Sparse phase detection diode patterns can suffer from problems due to aliasing, as the diodes in a phase detection pair can be located on opposite sides of a sharp edge. Phase detection autofocus can be particularly susceptible to errors due to aliasing in circumstances in which the target scene includes high frequency patterns. Further, aliasing can be more problematic in the monitoring state of an autofocus process; in the monitoring state the imaging system has already converged to an in-focus position and the target scene is monitored for changes that may require re-positioning the imaging system to a new in-focus (converged) position. This is due to the fact that high frequencies appear only when the target scene is in focus or close to the in-focus point. Accordingly, analysis of data received from imaging pixels to identify high frequency patterns and/or edges having a threshold level of sharpness can be used to eliminate or compensate for errors that might otherwise be introduced in the phase detection process due to aliasing.

The present phase detection autofocus technique can use imaging pixels in a neighborhood of a single phase detection pixel, illustrated below in FIG. 1 as a right phase detection pixel, to perform noise reduction on the phase detection process. Other examples can use a left pixel. Pixel values from neighboring pixels in various sizes of regions, for example 3×3, 5×5, 7×7, and so on can provide valuable information regarding the usefulness of a particular phase detection pixel for autofocus purposes.

Some examples can interpolate a center pixel value at the location of each phase detection pixel in a pair for performing noise reduction calculations. The center pixel value can be interpolated from four adjacent green pixels or from neighboring pixels in various sizes of regions, for example 5×5, 7×7, and the like. In some embodiments, the center interpolation process can be part of a process to compensate for a value at the phase detection pixel location in the final image, for example similar to defective pixel correction. Various implementations can include on-sensor logic for center interpolation or rely on an external ISP to perform the center interpolation process. The autofocus system can calculate a disparity value between the interpolated center pixel value and the phase detection pixel value for each of the phase detection pixels in the pair. If a difference between these disparity values is greater than a threshold, this can indicate that the phase detection pixels in the pair are likely located on opposing sides of an edge, and the pair of phase detection pixels may be excluded from autofocus calculations.

In another embodiment, the autofocus system can use data received from imaging pixels to perform edge detection, for example all imaging pixels or a subset of the imaging pixels in a predetermined neighborhood around a pair of phase detection pixels. The autofocus system can then compare the locations of edges to the known locations of the phase detection pixels to determine whether the phase detection pixels in the pair are likely located on opposing sides of an edge, and the pair of phase detection pixels may be excluded from autofocus calculations. Other suitable techniques for determining whether the phase detection pixels in a pair lie on opposite sides of a depth discontinuity, for example analysis of intensity variation in image pixel data, can also be used to exclude data received from such pairs of phase detection pixels from autofocus adjustment calculations. Excluding data from a pair of phase detection pixels located on opposite sides of an edge can include using data received from a subset of phase detection pixels not including the identified pair when generating a pair of half-images usable for phase difference detection.

Though discussed herein primarily in the context of masked phase detection pixels, the noise reduction techniques described herein are also applicable to mask-less phase detection pixels, for example receiving phase information due to microlens formation.

Various embodiments will be described below in conjunction with the drawings for purposes of illustration. It should be appreciated that many other implementations of the disclosed concepts are possible, and various advantages can be achieved with the disclosed implementations. Headings are included herein for reference and to aid in locating various sections. These headings are not intended to limit the scope of the concepts described with respect thereto. Such concepts may have applicability throughout the entire specification.

Overview of Example Phase Detection Microlens and Color Filter Arrangements

FIG. 1A depicts a schematic view of an example sensor portion 100 including a multi-diode microlens 110 to generate phase data. The sensor portion 100 includes single-diode microlenses 105, multi-diode microlens 110, a filter array 108 including a plurality of color filters 115, and photodiodes ("diodes") 120A-120D arranged in a sensor array 107. Multi-diode microlens 110 is sized and positioned such that incoming light from a target scene propagates through the multi-diode microlens 110 before falling incident on the includes diodes 120B, 120C of the sensor array 107, which are covered by the multi-diode microlens 110 such that light pa.

The diodes can be, for example, photodiodes formed in a semiconductor substrate, for example in a complementary metal-oxide semiconductor (CMOS) image sensor. As used herein, diode refers to a single unit of any material, semiconductor, sensor element or other device that converts incident light into current. The term "pixel" as used herein can refer to a single diode in the context of its sensing functionality due to adjacent optical elements such as color filters or microlenses. Accordingly, although "pixel" generally may refer to a display picture element, a "pixel" as used herein may refer to a sensor (for example, a photodiode) that receives light and generates a signal which if rendered on a display, may be displayed as a point in an image captured by the sensor (and a plurality of other sensors). The individual units or sensing elements of an array of sensors, for example in a CMOS or charge-coupled (CCD) device, can also be referred to as sensels.

Color filters 115 act as wavelength-selective pass filters and split (or filter) incoming light in the visible range into red, green, and blue ranges. The incoming light is, for example, from a target scene. The light is "split" by allowing only certain selected wavelengths to pass through the color filters 115, the filtering of light based on the configuration of the color filters 115. Various types of color filters 115 may be used. As illustrated in FIG. 1A, the split light is received by the dedicated red, green, or blue diodes 120A-120D. Although red, blue, and green color filters are commonly used, in other embodiments the color filters can vary according to the color channel requirements of the captured image data, for example including ultraviolet, infrared, or near-infrared pass filters.

Each single-diode microlens 105 is positioned over a single color filter 115 and a single diode 120A, 120D. Diodes 120A, 120D accordingly provide imaging pixel information. The color filters under the single-diode microlenses in a microlens array 106 can be positioned according to the Bayer pattern in some embodiments. Multi-diode microlens 110 is positioned over two adjacent color filters 115B, 115C and two corresponding adjacent diodes 120B, 120C. Diodes 120B, 120C accordingly provide phase detection pixel information by diode 120B receiving light entering multi-diode microlens 110 in a first direction and diode 120C receiving light entering multi-diode microlens 110 in a second direction. The color filters under the multi-diode microlenses in the microlens array 106 can be selected to pass the same wavelength of light in some embodiments.

As used herein, "over" and "above" refer to the position of a structure (for example, a color filter or lens) such that light incident from a target scene propagates through the structure before it reaches (or is incident on) another structure. To illustrate, the microlens array 106 is positioned above the color filter array, which is positioned above the diodes 120A-120D. Accordingly, light from the target scene first passes through the microlens array, then the color filter array, and finally is incident on the diodes 115A-115D.

FIG. 1A depicts (dashed) line 130 which should be understood is not a physical structure but rather is depicted to illustrate the phase detection capabilities provided by multi-diode microlens 110. The line 130 passes through the optical center of the multi-diode microlens 110 and is orthogonal to a plane formed by the color filter array of color filters 115A-115D. Where multi-diode microlens 110 is a 2×1 microlens, the multi-diode microlens 110 is formed such that light L(x) incident in a first direction, that is, entering the multi-diode microlens 110 from one side of the line 130, is collected in a first diode 120B. Light incident in a second direction, that is, entering the multi-diode microlens 110 from the other side of the line 130, is collected in a second diode 120C. Accordingly, data received from diodes 120B, 120C can be used for phase detection. Where multi-diode microlens is a 2×2 microlens, the multi-diode microlens 110 is formed such that light L(x) incident in four directions, with a direction considered as light passing through a quarter of the multi-diode microlens 110, is incident on four diodes.

Figure 1B:
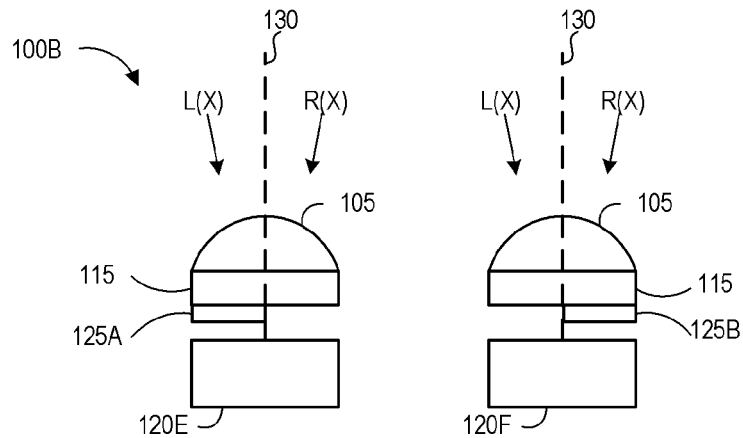
FIGS. 1B and 1C depict schematic views of example masked diodes for obtaining phase detection autofocus information.
Figure 1C:
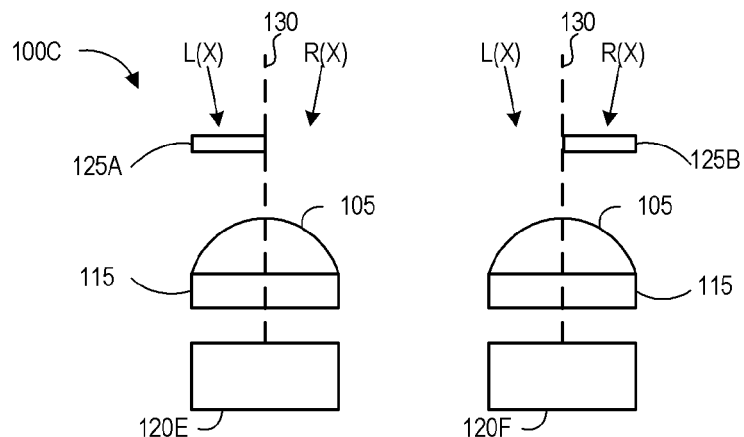

FIGS. 1B and 1C depict schematic views of example masked diodes for obtaining phase detection autofocus information. FIG. 1B illustrates an example arrangement 100B having masks 125A, 125B positioned below color filters 115, while FIG. 1C illustrates an example arrangement 100C having masks 125A, 125B positioned above color filters 115. Light from the target scene passes through a primary focusing lens assembly (not illustrated) before passing through masks 125A, 125B, microlenses 115, and color filters and then falls incident on a pair of phase detection diodes 120E, 120F. Phase detection diodes 120E, 120F may be adjacent to one another or may be spaced apart by one or more diodes, and may be in the same row or column or in different rows or columns, depending upon the design considerations of the image sensor.

The masks 125A, 125B allow only light incident in a specific direction (as depicted, from one side of dashed line 130 through the optical center of the single-diode microlens 105) to be selectively collected in the diodes 120E, 120F. For example, in order to generate a phase difference, light-blocking masks 125A, 125B are disposed over two diodes 120E, 120F in an opposite direction to produce a pair, and tens of thousands of pairs can be arranged in a two-dimensional matrix of an image sensor to obtain data for phase difference autofocus. The amount of light incident on the diodes 120E, 120F is reduced by 50% relative to imaging diodes by the half-apertures created by masks 125A, 125B with respect to the optical axes of the single-diode microlenses 105.

Figure 2A:
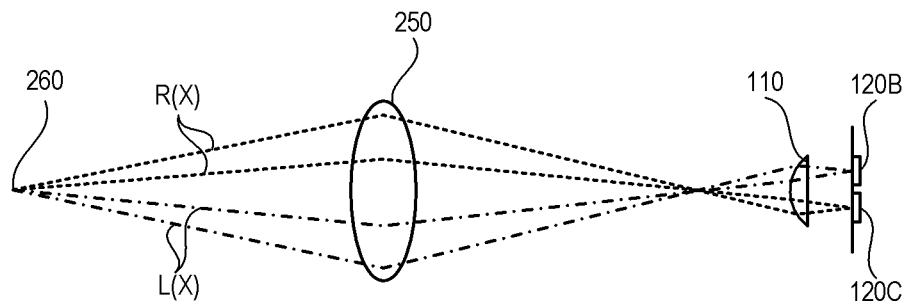
FIG. 2A depicts an example ray trace of light entering a pair of phase detection diodes.
Figure 2B:
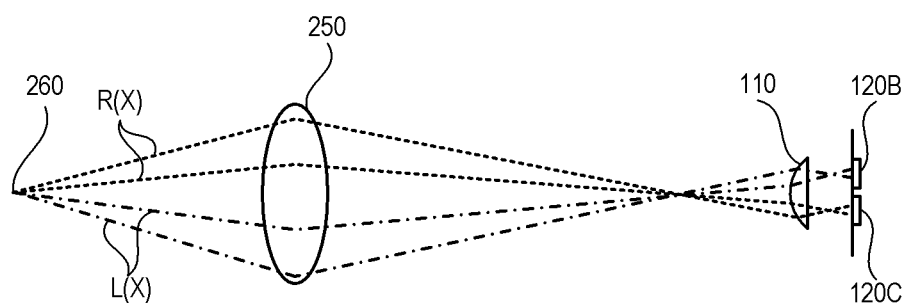
FIG. 2B depicts an example ray trace of light entering a pair of phase detection diodes.
Figure 2C:
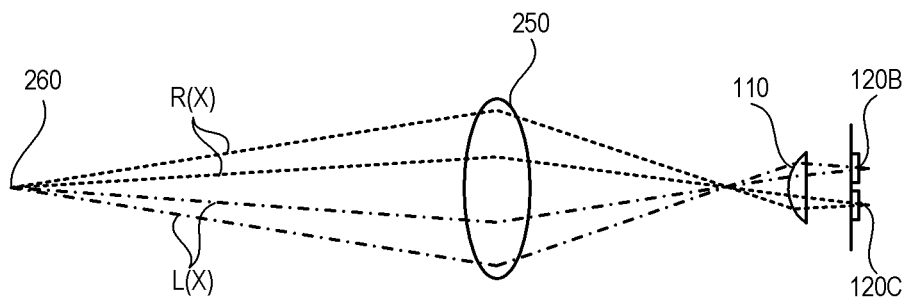
FIG. 2C depicts an example ray trace of light entering a pair of phase detection diodes.

FIGS. 2A-2C depict example ray traces of light traveling through a main lens 250 then through a multi-diode microlens 110 before falling incident on a pair of phase detection diodes 120B, 120C. It will be appreciated that the dimensions of the main lens 250 and the multi-diode microlens 110 are not shown to scale. The diameter of the multi-diode microlens 110 can be approximately equal to the distance spanning two adjacent diodes of an image sensor, while the diameter of the main lens 250 can be equal to or greater than the width (the distance along a row or column of diodes) of the image sensor.

Specifically, FIG. 2A depicts an example ray trace of an in-focus condition, FIG. 2B depicts an example ray trace of a front-focus condition, and FIG. 2C depicts an example ray trace of a back-focus condition. Light travels from a point 260 in a target scene, travels through lens 250 for focusing the target scene onto an image sensor including the phase detection diodes 120B, 120C, and passes through the multi-diode microlens 110 before falling incident the phase detection diodes 120B, 120C. As illustrated, diode 120B receives light from a left direction L(x) of the main lens 250 and diode 120C receives light from a right direction R(x) of the main lens 250. In some embodiments light from the left direction L(x) can be light from a left half (depicted as the lower half in the illustration of FIGS. 2A-1C) of the main lens 250 and light from the right direction R(x) can be light from a right half (depicted as the upper half in the illustration of FIGS. 2A-1C) of the main lens 250. Accordingly, a number of phase detection diodes interleaved with imaging diodes across the image sensor can be used to extract left and right images that are offset from a center image captured by the imaging diodes. Rather than right and left, other embodiments can use up and down images, diagonal images, or a combination of left/right, up/down, and diagonal images for calculating autofocus adjustments.

When the image is in focus, the left rays L(x) and right rays R(x) converge at the plane of the phase detection diodes 115B, 115C. As illustrated in FIGS. 1C and 2C, in front and back defocus positions the rays converge before and after the plane of the diodes, respectively. As described above, signals from the phase detection diodes can be used to generate left and right images that are offset from the center image in front or back defocus positions, and the offset amount can be used to determine an autofocus adjustment for the main lens 250. The main lens 250 can be moved forward (toward the image sensor) or backward (away from the image sensor) depending on whether the focal point is in front of the subject (closer to the image sensor), or behind the subject (farther away from the image sensor). Because the autofocus process can figure out both the direction and amount of movement for main lens 250, phase-difference autofocus can focus very quickly.

Figure 2D:
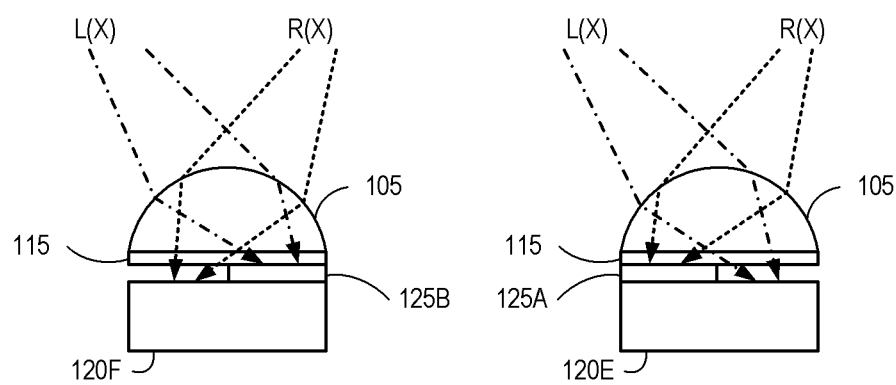
FIG. 2D depicts an example ray trace of light entering a pair of masked phase detection diodes.

FIG. 2D depicts an example ray trace of light traveling through a main lens (not illustrated) then through apertures formed by phase detection masks 125A, 12B before falling incident on the pair of phase detection diodes 120F, 120E. FIG. 2D depicts a back-focus condition, as the rays from the left L(x) and right R(x) sides of the main lens converge behind the plane of the image sensor. As illustrated, light from the right R(x) side of the main lens falls incident on diode 120F, while light from the left L(x) side of the main lens falls incident on diode 120E due to the half-apertures created by phase detection masks 125A, 12B.

Overview of Example Multi-Image Phase Detection Autofocus

Figure 3A:
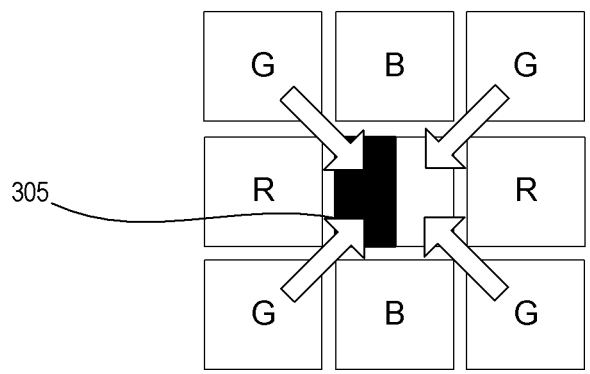
FIGS. 3A and 3B depict graphical representations of example methods for calculating a center pixel value.

FIG. 3A depicts a graphical representation of an example method for calculating a center pixel value for a masked phase detection diode. As used herein, "center pixel value" refers to a color and/or brightness value interpolated at the location of a phase detection diode using signals received from one or more nearby imaging diodes. Although the example of FIG. 3A depicts a masked phase detection diode, other implementations may use the multi-diode microlens described above to produce phase data.

As shown in the illustration of FIG. 3A, in one embodiment a center pixel value can be interpolated at the location 305 of a phase detection diode based on four diagonally-adjacent green pixel values. This approach can be used in some implementations having a green color filter at the location 305 over the phase detection diode. In other examples the center value can be calculated from neighboring pixels of any color in various sizes of regions, for example 5×5, 7×7, and the like.

In some embodiments, the phase detection diode may have a clear color filter or no color filter disposed over the diode. Although another filter, for example an infrared cut-off filter, may still be disposed over the diode, the phase detection diode under the clear color filter or no color filter receives visible light that has not been color filtered. Accordingly, the brightness of the light incident on the diode can be increased relative to a diode having a wavelength-selective pass filter, which may be beneficial for provide phase data in low light settings due to the reduction of light incident on the diode by the half-aperture. In such embodiments, the center pixel value can be interpolated based on neighboring pixel values of all colors, for example values received from all eight diodes in a 3×3 neighborhood surrounding the location of the phase detection diode. In one example, a linear weighting function can be used to determine the center pixel value from the eight diodes in the 3×3 neighborhood.

A center image can be constructed from center pixel values from a number of locations across the image sensor. Half-images can be constructed from values received from phase detection diodes at a number of locations across the image sensor.

Figure 3B:
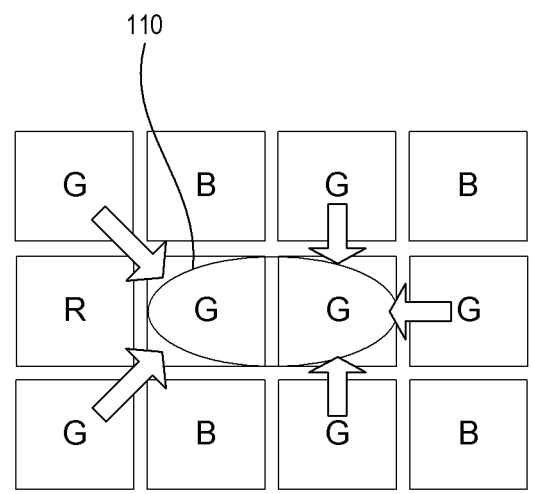

FIG. 3B depicts a graphical representation of an example method for calculating a center pixel value for a pair of phase detection diodes under a multi-diode microlens 110. In the illustrated example, both diodes under the multi-diode microlens 110 are below green color filters. Accordingly, five green pixel values in a 3×4 neighborhood surrounding the multi-diode microlens 110 are used to calculate the center pixel value. In other embodiments, green pixel values from differing neighborhoods can be used, for example two green values from a 5×1 neighborhood along the row of the multi-diode microlens, green values from a 5×6 neighborhood, etc.

In another embodiment, both diodes under the multi-diode microlens 110 can be below clear color filters. In such embodiments, the center pixel value can be determined based on neighboring pixel values of all colors, for example values received from all ten diodes in the 3×4 neighborhood surrounding the location of the multi-diode microlens 110. In one example, a linear weighting function can be used to determine the center pixel value from the ten diodes in the 3×4 neighborhood.

The same center pixel value can be used for both diodes under the multi-diode microlens 110, that is, half-images generated based partly on values received from both diodes under the multi-diode microlens 110 can be compared to a center image generated based partly on the center pixel value.

Figure 3C:
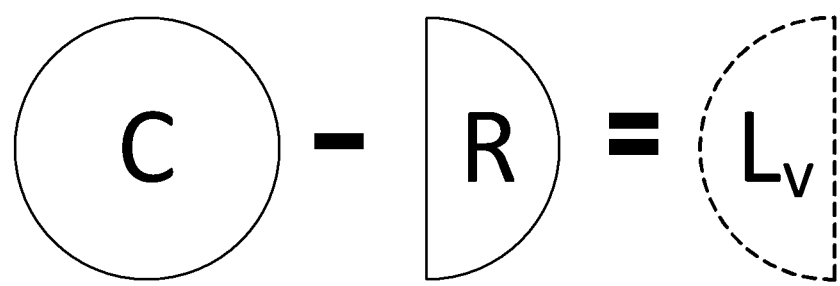
FIG. 3C depicts a graphical representation of an example method for calculating a virtual pixel value.

FIG. 3C depicts a graphical representation of an example method for calculating a virtual pixel value. In the illustrated example, a value received from a right phase detection sensel (a diode such as diodes 120C, 120E described above receiving light from a right R(x) side of a focusing lens assembly) is subtracted from the interpolated center pixel value to produce a virtual phase detection pixel value, depicted as virtual left phase detection pixel value $L_v$. Right phase detection pixel value R and virtual left phase detection pixel value $L_v$ form a pair of opposing phase detection pixels that can be used in some embodiments to generate half-images together with a number of other right and virtual left phase detection pixel values. The half-images can be compared to one another for determining phase difference usable for determining an autofocus adjustment.

It will be appreciated that similar techniques can be used to generate virtual right, up, down, and diagonal phase detection pixel values at the location of an opposing phase detection pixel in a pair.

Figure 3D:
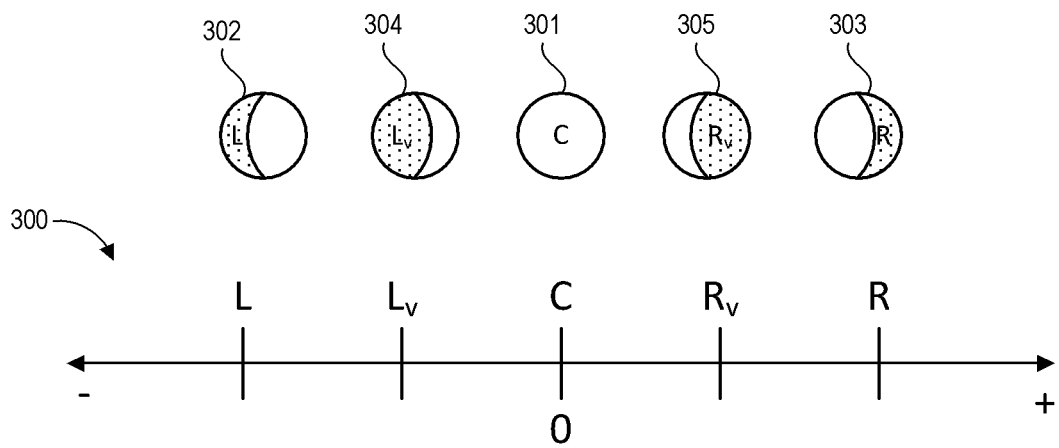
FIG. 3D illustrates a graphical representation of offset of various phase detection images.

FIG. 3D illustrates a graphical representation of an offset continuum 300 depicting the offset various phase detection pixel values L, $L_v$, R, and $R_v$ relative to a center pixel value C when the imaging system used to capture the images is in a defocus condition. The offset indicates an amount of defocus and a direction of defocus compared to a focus point. As will be understood, in an in-focus condition there is little or no offset, and the pixel values C, L, $L_v$, R, and $R_v$ would be located at the same point on the offset continuum 300.

The defocus condition and its effect on the C, L, $L_v$, R, and $R_v$ pixel values is illustrated by the circle of confusion diagrams 301-305 above the offset continuum 300. A circle of confusion, also referred to as a blur spot, is an optical spot caused by a cone of light rays not coming to a focus point at the plane of the image sensor when imaging a point source, for example occurring in the focus conditions illustrated in FIGS. 2B and 2C. A whole blur spot 301 is illustrated corresponding to the center pixel value, which represents light incident on a sensel through an unmasked aperture. A crescent-shaped blur spot 302, illustrated in comparison to the shape of the blur spot 301, is incident on a sensel under a mask blocking a right half (or approximate half) of the aperture above the sensel, thereby producing the left phase detection pixel value L. Similarly, a crescent-shaped blur spot 303, illustrated in comparison to the shape of the blur spot 301, is incident on a sensel under a mask blocking a left half (or approximate half) of the aperture above the sensel, thereby producing the right phase detection pixel value R. The blur spot 304 of the virtual left $L_v$ pixel, having been calculated as the subtraction of the crescent-shaped blur spot 303 of the right phase detection pixel from the whole blur spot 301 of the pixel value C, is approximately marquise-shaped or lens-shaped. Similarly, the blur spot 305 of the virtual right $R_v$ pixel, having been calculated as the subtraction of the crescent-shaped blur spot 302 of the left phase detection pixel from the whole blur spot 301 of the pixel value C, is approximately marquise-shaped or lens-shaped.

As described above, the center pixel value C can be used, together with a number of other calculated center pixel values, to generate a center image. Phase detection pixel values L, $L_v$, R, and $R_v$, can be used, together with a number of a number of other left, virtual left, right, and virtual right phase detection pixel values, respectively, to generate half-images usable for detecting phase difference.

The center image C is illustrated as having no offset (located at the zero point along the offset continuum 300). The left L and right R pixel values are illustrated as having an negative and positive offsets, respectively, from the center pixel value C, based on the center of mass of the corresponding one of crescent-shaped blur spots 302, 303. Typical phase detection autofocus processes use the disparity between the left L and right R pixel values to calculate an autofocus adjustment. However, in the phase detection autofocus processes described herein, the autofocus adjustment can be calculated based on disparity between images generated from a number of left pixel values L and center pixel values C, right pixel values R and center pixel values C, or based on both disparities.

Performing phase detection between a center image and a left or right image generated based on values corresponding to the same sensel locations can result in a less noisy phase detection autofocus process when compare to performing autofocus using a left image and a right image generated base on values received from different sensel locations (for example, from a pair of left and right phase detection sensels positioned with a number of imaging sensels in between) due to reducing the effects of aliasing. Further, in some embodiments the resolution of the phase detection process can be doubled by using disparities between both the center image and the left image and the center image and the right image. In other embodiments the number of phase detection sensels on the sensor can be reduced, thereby producing less artifacts in captured image data.

Further, the virtual left $L_v$ and virtual right $R_v$ pixel values are illustrated as having negative and positive offsets, respectively, from the center image C. The distance between the center of mass of center blur spot 301 and the center of mass of the crescent-shaped blur spots 302, 303 corresponding to the actual left and right phase detection pixels is greater than the distance between the center of mass of center blur spot 301 and the center of mass of the lens-shaped blur spots 204, 305 corresponding to the virtual left $L_v$ and virtual right $R_v$ pixels. Thus, the offset of the virtual left $L_v$ and virtual right $R_v$ pixel values from the center pixel value C can be smaller than the offset of corresponding left L and right R pixel values from the center pixel value C. For example, the masked sensels used to produce the left L and right R pixel values may have masks that do not create an aperture perfectly centered on the optical axis of the microlens above the masked sensel, for example by being sized or positioned such that the effective reduced aperture is not exactly aligned with the microlens optical axis. As another example, the center of mass of the blur generated by a left L pixel value may be offset from the center of mass of the center pixel value C by more or less than the center of mass of the blur generated by the corresponding virtual right $R_v$ pixel value.

In some implementations, phase detection correlation can be performed using any or all using the following combinations of images:

(1) the virtual left image with the right image or virtual right image, (2) the virtual right image with the left image or virtual left image, and (3) the center image and any of the other four images.

Some implementations can create a combined right image based on the right virtual phase detection pixel values and the right actual phase detection pixel values and also create a combined left image based on the left virtual phase detection pixel values and the left actual phase detection pixel values; such implementations can then perform left-right image correlation on the combined images, thereby doubling the amount of phase detection information compared to a typical left-right correlation performed without virtual phase detection information. In one example of a robust phase detection algorithm, correlation can be searched for across all possible combinations of the five images illustrated in FIG. 3D.

In one embodiment, generation of the center image and half-images for phase detection can be performed on-sensor. In other implementations the center image and half-images can be generated by an image signal processor based on values received from phase detection diodes and nearby imaging diodes.

Overview of Example Phase Detection Noise Reduction Techniques

Sparse phase detection diode patterns can suffer from problems due to aliasing, as the diodes in a phase detection pair can be located on opposite sides of an edge. Phase detection autofocus can be particularly susceptible to errors due to aliasing in circumstances in which the target scene includes high frequency patterns. Further, aliasing can be more problematic in the monitoring state of an autofocus process; in the monitoring state the imaging system has already converged to an in-focus position and the target scene is monitored for changes that may require re-positioning the imaging system to a new in-focus (converged) position. This is due to the fact that high frequencies appear only when the target scene is in focus or close to the in-focus point. Accordingly, analysis of data received from imaging pixels to identify high frequency patterns and/or edges having a threshold level of sharpness can be used to eliminate or compensate for errors that might otherwise be introduced in the phase detection process due to aliasing.

Figure 4A:
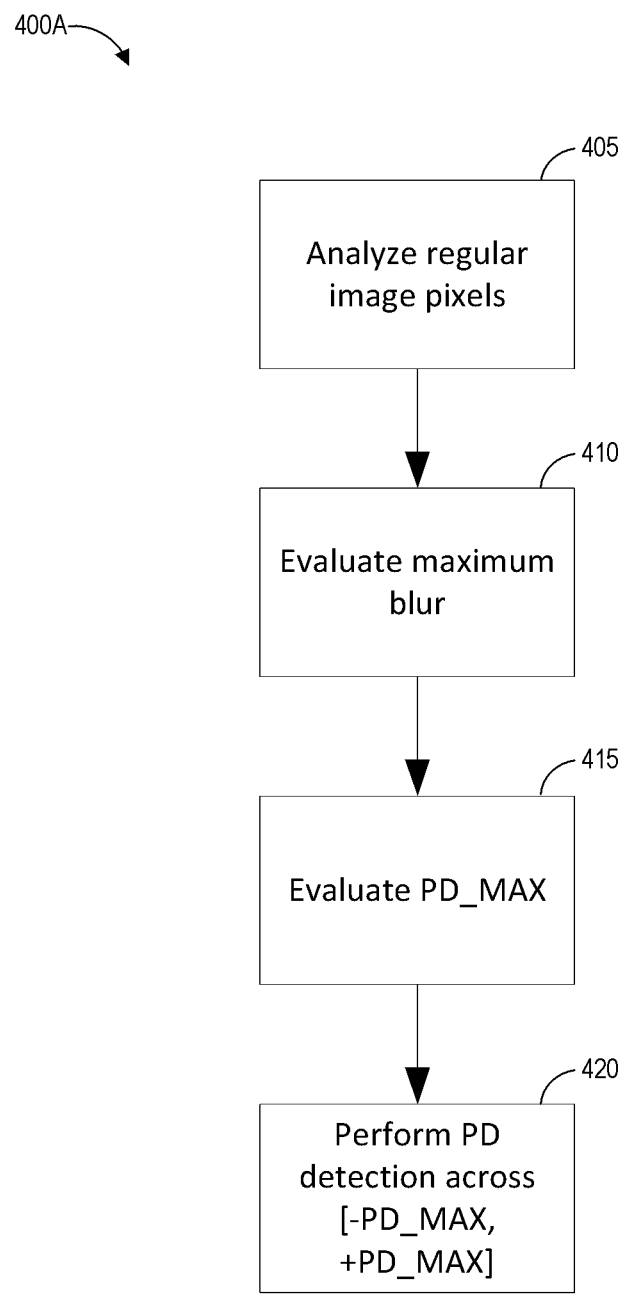
FIG. 4A illustrates a flowchart of one embodiment of a process for performing a noise-reduced phase detection autofocus process as described herein.

FIG. 4A illustrates a flowchart of one embodiment of a process for performing a noise-reduced phase detection autofocus process 400A as described herein. The process phase detection autofocus process 400A can be used to optimize the phase detection search range by limiting the possible disparity values based on analysis of imaging pixel data. Some embodiments of the phase detection autofocus process 400A can be performed on-sensor, and other embodiments can be performed with the use of an image signal processor.

At block 405, the process 400A can analyze regular image pixels. This can include, for example, receiving data representing values of light collected in diodes of an image sensor that are not dedicated to phase detection. At block 410, the process 400A can evaluate the maximum blur. As used herein, "maximum blur" refers to the level of blur in image data that can be used to limit phase detection for autofocus. The maximum blur can be the level of blurriness of a most-in focus portion of the image, for example a most in-focus region within a focus region of interest.

In some embodiments, the maximum blur can be estimated using contrast focus statistics blocks. For example, in contrast-based autofocus techniques, part of the analysis can be implemented in a HW block to output a focus value in a certain region of interest (ROI). Such techniques may get multiple focus values for different locations, for example as a grid mapped to part or the whole image, or may get a separate focus value configured for multiple windows.

In one implementation, the maximum blur can be a value representing an amount of blur of a sharpest edge identified in the data from the imaging pixels. Accordingly, the blocks 405, 410 of analyzing the image data from imaging pixel and evaluating the maximum blur can involve performing edge detection on the image data, identifying a sharpest edge, and determining a level of blur of the sharpest edge.

In one implementation, blocks 405 and 410 can involve the following steps. A horizontal Fourier Transform or fast Fourier Transform can be performed on the image data from the imaging pixels. Next, the process 400A can search for a highest frequency in the resulting data having an energy above a predetermined threshold. The process 400A can apply two linear filters, for example a finite impulse response filter or an infinite impulse response filter. Each of the two filters can be configured to have a different band pass. A first filter of the two filters can be configured with a high frequency band pass (for example, 0.5-0.2 cycles/pixel) and a second filter of the two filters can be configured with a low frequency band pass (for example, 0.2-0.1 cycles/pixel).

In one implementation, if the energy in the data resulting from the high frequency band pass is above the predetermined threshold, the process 400A can estimate that the maximum blur is 5 pixels, else if the energy in the data resulting from the low frequency band pass is above the predetermined threshold then the process 400A can estimate that the maximum blur is 10 pixels, and otherwise the process 400A cannot limit phase detection by a maximum blur.

At block 415, the process 400A can evaluate a phase difference value PD_MAX corresponding to the evaluated maximum blur. This value represents a bounding phase difference value, and valid phase difference values can be expected to fall within a range between positive and negative values of the bounding phase difference value. Accordingly, the phase difference can be limited to not exceed the estimated level of defocus of an in-focus region of interest of the image as determined by the analysis of the data received from imaging diodes.

At block 420, the process 400A can perform phase difference detection across the range defined by the phase difference value corresponding to the blur of the in-focus region of interest, depicted as [−PD_MAX, +PD_MAX]. As discussed below with respect to FIG. 5, phase difference detection can include the following steps. Left and right channels (also referred to herein as left and right half-images or left and right images) can be extracted from data received from left and right phase detection diodes, and the left and right channels can be corrected for uniformity, for example using a gain map similar to correction of lens shading. The process 400A can then find the horizontal correlation between the left and right channels. This can involve searching within a range of positive and negative pixel shifts, for example −3 pixels to +3 pixels, and this search range can be scaled according to the maximum blur as discussed above. For each pixel shift, the process 400A can measure the sum of absolute difference (SAD) to obtain a SAD vector, and can interpolate the SAD vector to find an optimal correlation point between the channels. The phase detection offset determined by the correlation is then converted into a defocus lens position change n, for example using linear mapping, polynomial function, multi-segment linear, a look-up table, or any other suitable function. The determined phase difference can be used for calculating an autofocus adjustment, for example by being used to determine a direction and amount of movement of a focusing lens to position the focusing lens at an in-focus position.

Figure 4B:
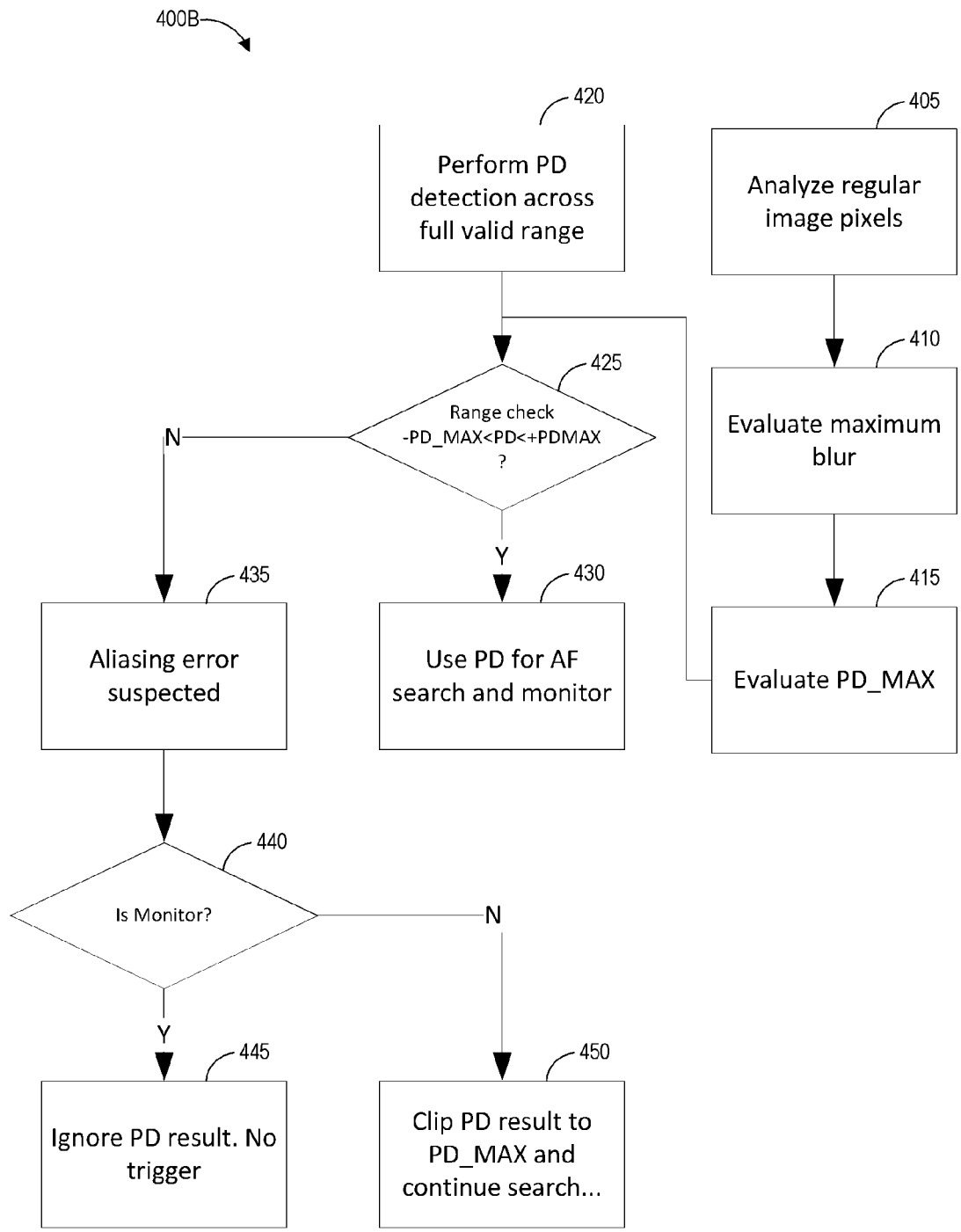
FIG. 4B illustrates a flowchart of another embodiment of a process for performing a noise-reduced phase detection autofocus process as described herein.

FIG. 4B illustrates a flowchart of another embodiment of a process 400B for performing a noise-reduced phase detection autofocus process as described herein. The process phase detection autofocus process 400B can be used to compensate aliasing errors that can occur in the focus monitoring phase of autofocus by ignoring disparity values that exceed a maximum determined based on analysis of imaging pixel data. Some embodiments of the phase detection autofocus process 400B can be performed on-sensor, and other embodiments can be performed with the use of an image signal processor.

At block 420, the process 400B performs phase difference detection across the full range of available differences received from phase detection diodes. Simultaneously or sequentially, blocks 405, 410, and 415 described above with respect to FIG. 4A are performed to identify a phase difference range corresponding to the level of blur in an in-focus region of interest of data received from imaging pixels.

The phase difference range derived from blocks 405, 410, and 415 is used, at block 425, to perform a range check on the phase difference detection performed at block 420. The range check identifies whether the identified phase difference (depicted as PD in block 420) falls within the range of [−PD_MAX, +PD_MAX].

If the identified phase difference falls within the determined phase difference range, then the process 400B moves to block 430 to use the identified phase difference to calculate an autofocus adjustment. After the lens and/or sensor of the imaging system are moved to the in-focus position corresponding to the determined autofocus adjustment, the process 400B indicates a transition to the monitoring state of autofocus. In some embodiments, this can involve periodic repetition of the process 400A of FIG. 4A. In other embodiments, this can involve re-initializing blocks 420 and 405 of process 400B.

If the identified phase difference does not within the determined phase difference range, then the process 400B moves to block 435 indicating than an aliasing error is suspected. As described above, aliasing can cause the identified phase difference value to exceed an actual level of blur of an in-focus portion of the image.

At block 440, the process 400B identifies whether the autofocus process is in the monitoring state. For example, the process 400B can determine whether the imaging system has already been moved to (or was determined to already be in) an in-focus position. If the autofocus process is not in the monitoring state, then the 400B moves to block 445 to ignore the identified phase difference. At this point, blocks 420 and 405 can be re-initialized.

If the autofocus process is in the monitoring state, then the 400B moves to block 450 to clip the identified phase difference to PD_MAX, the phase difference determined to correspond to the level of blur in the in-focus region of interest. The process 400B can then re-initialize blocks 420 and 405 or can switch, in some embodiments, to the focus monitoring process 400A of FIG. 4A.

Some imaging apparatuses may implement process 400A and/or 400B to determine a bounding phase difference value separately for multiple regions of image information. For example, image information can be partitioned into a grid across the field of view (for example a 5×5 grid). In another example, the imaging apparatus can determine a bounding phase difference value on each line of image data separately and then combine the bounding phase difference values or select one of the bounding phase difference values to use for determining the valid phase difference range for autofocus calculations. The imaging apparatus can also remove the noise (phase detection sensel pairs having out-of-range disparity values) for each region separately and/or disqualify shift phase detection sensel values that that are out of bound for specific lines/regions.

In another embodiment of a noise reduction phase detection technique, the imaging apparatus can interpolate a center pixel value at the location of each phase detection pixel in a pair for performing noise reduction calculations. The center pixel value can be interpolated from four adjacent green pixels or from neighboring pixels in various sizes of regions, for example 5×5, 7×7, and the like. In some embodiments, the center interpolation process can be part of a process to compensate for a value at the phase detection pixel location in the final image, for example similar to defective pixel correction. Various implementations can include on-sensor logic for center interpolation or rely on an external ISP to perform the center interpolation process. The imaging apparatus can calculate a disparity value between the interpolated center pixel value and the phase detection pixel value for each of the phase detection pixels in the pair. If a difference between these disparity values is greater than a threshold, this can indicate that the phase detection pixels in the pair are likely located on opposing sides of an edge, and the pair of phase detection pixels may be excluded from autofocus calculations.

In another embodiment, the imaging apparatus can use data received from imaging pixels to perform edge detection, for example all imaging pixels or a subset of the imaging pixels in a predetermined neighborhood around a pair of phase detection pixels. The imaging apparatus can then compare the locations of edges to the known locations of the phase detection pixels to determine whether the phase detection pixels in the pair are likely located on opposing sides of an edge, and the pair of phase detection pixels may be excluded from autofocus calculations. Other suitable techniques for determining whether the phase detection pixels in a pair lie on opposite sides of a depth discontinuity, for example analysis of intensity variation in image pixel data, can also be used to exclude data received from such pairs of phase detection pixels from autofocus adjustment calculations. Excluding data from a pair of phase detection pixels located on opposite sides of an edge can include using data received from a subset of phase detection pixels not including the identified pair when generating a pair of half-images usable for phase difference detection.

Overview of Example Phase Detection Autofocus Process

Figure 5:
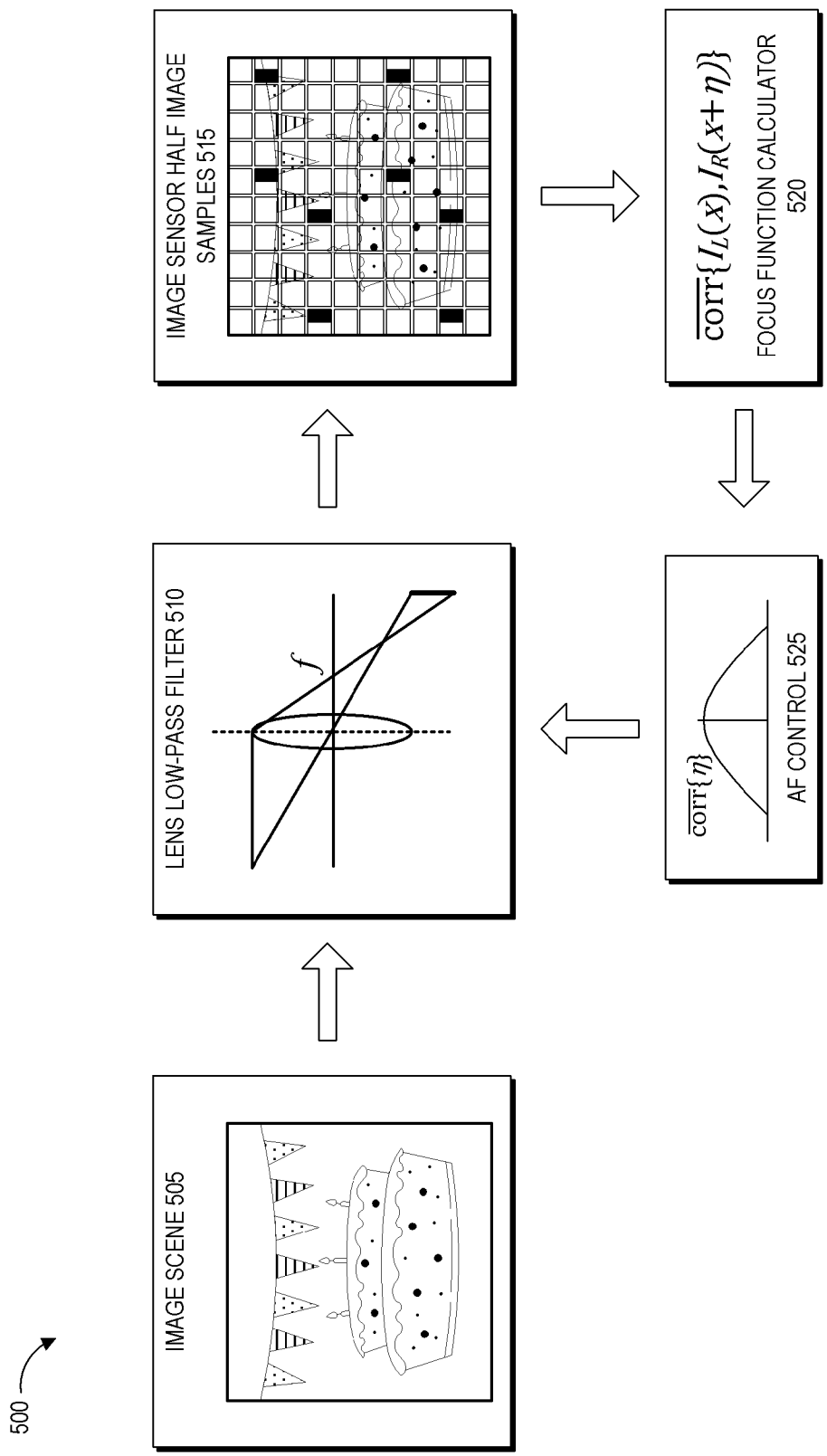
FIG. 5 depicts a high-level overview of an example phase detection autofocus process using a sensor having the multi-diode microlenses.

FIG. 5 depicts a high-level overview of an example phase detection autofocus process 500 that can implement the multi-image phase detection and noise reduction processes described herein. In one embodiment, the process 500 can be performed on-sensor. In other implementations, the process 500 can involve one or more processors, for example image signal processor 620 of FIG. 6. Light representing the target scene 505 is passed through the lens assembly 510 and received by the image sensor, where half-image samples 515 are produced as described above. The half-image samples can include a right image, virtual right image, left image, virtual left image, and a center image.

The lens assembly 510 can be modeled as a linear low-pass filter with a symmetric impulse response, wherein the impulse response (also referred to as the point spread function) of the lens assembly 510 is of a rectangular shape with a width parameter proportional to the distance between the sensor and the image plane. The scene is "in focus" when the sensor is in the image plane, that is, in the plane where all rays from a single point at the scene converge into a single point. As shown in FIG. 2, the half-image samples can save two images containing only information from the phase detection pixels. The half-images can be considered as convolutions of the target scene with left and right (or, in other examples, up and down) impulse responses of the lens assembly 510. In sensor embodiments using the techniques of FIGS. 3A-3D, more partial images can be saved.

A focus function calculator 520 applies a cross-correlation function to the partial images to determine disparity. As described above, cross-correlation can be searched for across one or more pairs of images selected from the right image, virtual right image, left image, virtual left image, and a center image. Further, cross-correlation may be limited to a range determined by analyzing data received from imaging diodes to estimate a level of focus of an in-focus region of interest of the data.

The cross-correlation function of the left and right impulse responses of the lens assembly 510 can be approximately symmetric and unimodal, however due to the nature of the target scene 505, the cross-correlation function as applied to the left and right captured images may have one or more false local maxima. Various approaches can be used to identify the true maximum of the cross-correlation function. The result of the cross-correlation function is provided as feedback to the autofocus control 525, which can be used to drive a lens actuator to move the primary focusing lens assembly 510 to a desired focus position. Other embodiments may use a stationary primary focusing lens assembly and move the image sensor to the desired focus position. Accordingly, in the phase detection autofocus process 500, focusing is equivalent to searching for the cross-correlation function maximum. This is a fast process that can be done quickly enough to provide focus adjustment for each frame at typical frame rates, for example at 30 frames per second, and thus can be used to provide smooth autofocusing for video capture. Some implementations combine phase detection autofocus with contrast-based autofocus techniques, for example to increase accuracy.

When the primary focusing lens assembly and/or image sensor are in the desired focus position, the image sensor can capture in-focus imaging pixel information and phase detection pixel information and, as described above, calculate and interpolate color values for the phase detection pixels. The imaging pixel values and determined phase detection pixel values can be output for demosaicking and, optionally, other image processing techniques to generate a final image of the target scene.

Overview of Example Phase Detection Autofocus Process

Figure 6:
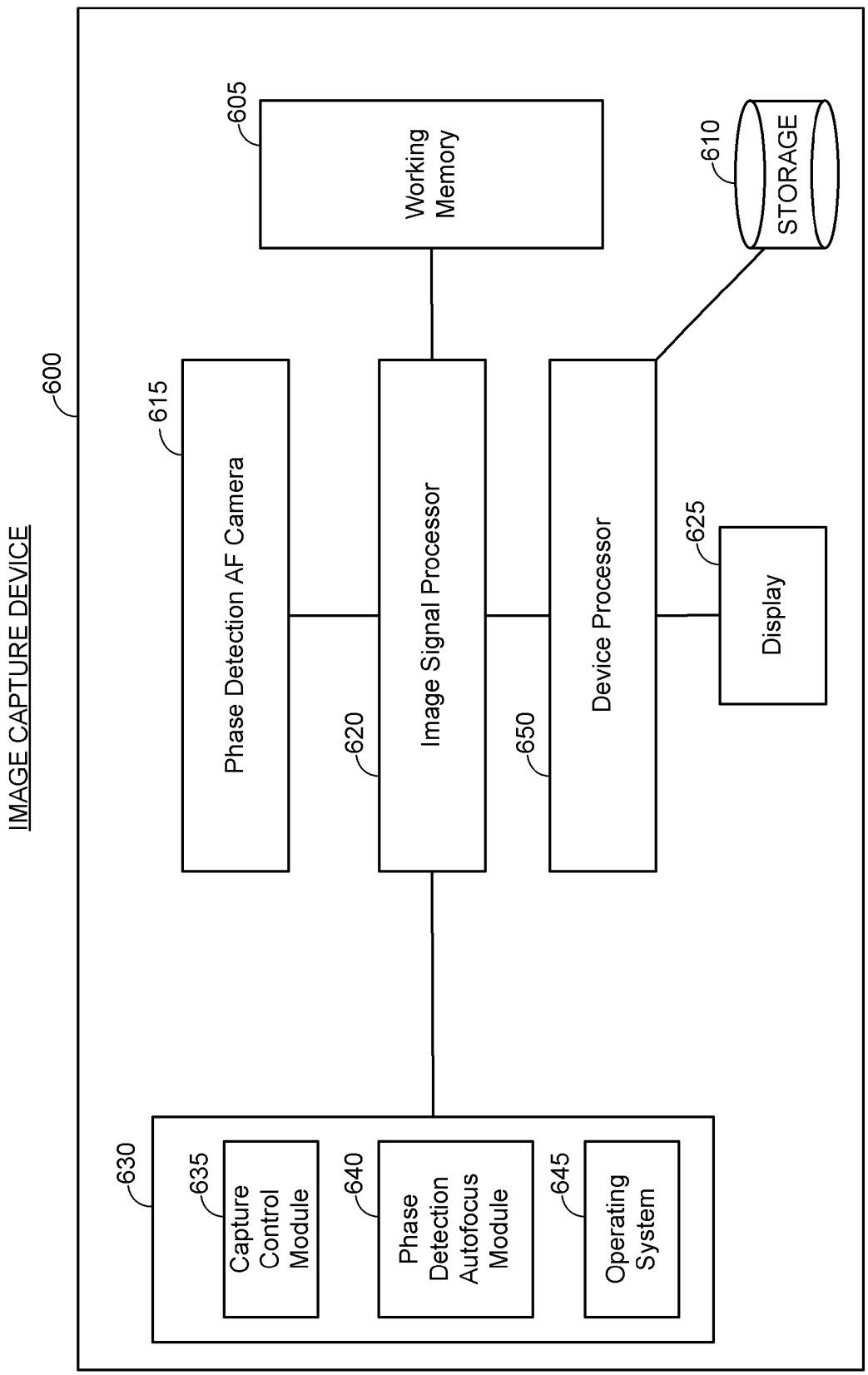
FIG. 6 depicts a schematic block diagram illustrating an example of an imaging system equipped with the phase detection autofocus devices and techniques.

FIG. 6 illustrates a high-level schematic block diagram of an embodiment of an image capture device 600 having multispectral iris authentication capabilities, the image capture device 600 having a set of components including an image signal processor 620 linked to a phase detection autofocus camera 615. The image signal processor 620 is also in communication with a working memory 605, memory 630, and device processor 650, which in turn is in communication with storage module 610 and an optional electronic display 625.

Image capture device 600 may be a portable personal computing device such as a mobile phone, digital camera, tablet computer, personal digital assistant, or the like. There are many portable computing devices in which using the phase detection autofocus techniques as described herein would provide advantages. Image capture device 600 may also be a stationary computing device or any device in which the multispectral iris verification techniques would be advantageous. A plurality of applications may be available to the user on image capture device 600. These applications may include traditional photographic and video applications as well as data storage applications and network applications.

The image capture device 600 includes phase detection autofocus camera 615 for capturing external images. The phase detection autofocus camera 615 can include an image sensor having multi-diode microlenses and color filters, or masked phase detection pixels, arranged according to the embodiments described above. The phase detection autofocus camera 615 can also have a primary focusing mechanism positionable based at least partly on data received from the image signal processor 620 to produce an in-focus image of the target scene. In some embodiments, the primary focusing mechanism can be a movable lens assembly positioned to pass light from the target scene to the sensor. In some embodiments, the primary focusing mechanism can be a mechanism for moving the sensor.

The sensor of the phase detection autofocus camera 615 can have different processing functionalities in different implementations. In one implementation, the sensor may not process any data, and the image signal processor 620 may perform all needed data processing. In another implementation, the sensor may be capable of extracting phase detection pixels, for example into a separate Mobile Industry Processor Interface (MIPI) channel. Further, the sensor may additionally be capable of interpolating center pixel values, for example in a RAW channel. In some implementations the sensor may additionally be capable of interpolating center pixel values, for example in a normal channel, and may be able to process the whole phase detection calculation internally (on-sensor). For example, the sensor may include analog circuitry for performing sums, subtractions, and/or comparisons of values received from diodes. An imaging apparatus as described herein may include an image sensor capable of performing all phase detection calculations or an image sensor capable of performing some or no processing together with an image signal processor 620 and/or device processor 650.

The image signal processor 620 may be configured to perform various processing operations on received image data in order to execute phase detection autofocus and image processing techniques. Image signal processor 620 may be a general purpose processing unit or a processor specially designed for imaging applications. Examples of image processing operations include demosaicking, white balance, cross talk reduction, cropping, scaling (e.g., to a different resolution), image stitching, image format conversion, color interpolation, color processing, image filtering (e.g., spatial image filtering), lens artifact or defect correction, etc. The image signal processor 620 can also control image capture parameters such as autofocus and auto-exposure. Image signal processor 620 may, in some embodiments, comprise a plurality of processors. Image signal processor 620 may be one or more dedicated image signal processors (ISPs) or a software implementation of a processor. In some embodiments, the image signal processor 620 may be optional for phase detection operations, as some or all of the phase detection operations can be performed on the image sensor.

As shown, the image signal processor 620 is connected to a memory 630 and a working memory 605. In the illustrated embodiment, the memory 630 stores capture control module 635, phase detection autofocus module 640, and operating system module 645. The modules of the memory 630 include instructions that configure the image signal processor 620 of device processor 650 to perform various image processing and device management tasks. Working memory 605 may be used by image signal processor 620 to store a working set of processor instructions contained in the modules of memory. Alternatively, working memory 605 may also be used by image signal processor 620 to store dynamic data created during the operation of image capture device 600.

As mentioned above, the image signal processor 620 is configured by several modules stored in the memories. The capture control module 635 may include instructions that configure the image signal processor 620 to adjust the focus position of phase detection autofocus camera 615, for example in response to instructions generated during a phase detection autofocus technique. Capture control module 635 may further include instructions that control the overall image capture functions of the image capture device 600. For example, capture control module 635 may include instructions that call subroutines to configure the image signal processor 620 to capture multispectral image data including one or more frames of a target scene using the phase detection autofocus camera 615. In one embodiment, capture control module 635 may call the phase detection autofocus module 240 to calculate lens or sensor movement needed to achieve a desired autofocus position and output the needed movement to the imaging processor 220. Capture control module 635 may call the phase detection autofocus module 240 to interpolate color values for pixels positioned beneath multi-pixel microlenses.

Accordingly, phase detection autofocus module 640 can store instructions for executing phase detection autofocus, for example according to processes 400A, 400B, and 500 described above with respect to FIGS. 4A, 4B, and 5. Phase detection autofocus module 640 can also store instructions for calculating center pixel values and virtual phase detection pixel values as described above with respect to FIGS. 3A-3C.

Operating system module 645 configures the image signal processor 620 to manage the working memory 605 and the processing resources of image capture device 600. For example, operating system module 645 may include device drivers to manage hardware resources such as the phase detection autofocus camera 615. Therefore, in some embodiments, instructions contained in the image processing modules discussed above may not interact with these hardware resources directly, but instead interact through standard subroutines or APIs located in operating system component 650. Instructions within operating system 645 may then interact directly with these hardware components. Operating system module 645 may further configure the image signal processor 620 to share information with device processor 650.

Device processor 650 may be configured to control the display 625 to display the captured image, or a preview of the captured image, to a user. The display 625 may be external to the imaging device 200 or may be part of the imaging device 200. The display 625 may also be configured to provide a view finder displaying a preview image for a use prior to capturing an image, for example to assist the user in aligning the image sensor field of view with the user's eye, or may be configured to display a captured image stored in memory or recently captured by the user. The display 625 may comprise an LCD, LED, or OLED screen, and may implement touch sensitive technologies.

Device processor 650 may write data to storage module 610, for example data representing captured images and data generated during phase detection and/or pixel value calculation. While storage module 610 is represented schematically as a traditional disk device, storage module 610 may be configured as any storage media device. For example, the storage module 610 may include a disk drive, such as an optical disk drive or magneto-optical disk drive, or a solid state memory such as a FLASH memory, RAM, ROM, and/or EEPROM. The storage module 610 can also include multiple memory units, and any one of the memory units may be configured to be within the image capture device 600, or may be external to the image capture device 600. For example, the storage module 610 may include a ROM memory containing system program instructions stored within the image capture device 600. The storage module 610 may also include memory cards or high speed memories configured to store captured images which may be removable from the camera. The storage module 610 can also be external to image capture device 600, and in one example image capture device 600 may wirelessly transmit data to the storage module 610, for example over a network connection. In such embodiments, storage module 610 may be a server or other remote computing device.

Although FIG. 6 depicts an image capture device 600 having separate components to include a processor, imaging sensor, and memory, one skilled in the art would recognize that these separate components may be combined in a variety of ways to achieve particular design objectives. For example, in an alternative embodiment, the memory components may be combined with processor components, for example to save cost and/or to improve performance.

Additionally, although FIG. 6 illustrates two memory components, including memory 630 comprising several modules and a separate memory component comprising a working memory 605, one with skill in the art would recognize several embodiments utilizing different memory architectures. For example, a design may utilize ROM or static RAM memory for the storage of processor instructions implementing the modules contained in memory 630. The processor instructions may be loaded into RAM to facilitate execution by the image signal processor 620. For example, working memory 605 may comprise RAM memory, with instructions loaded into working memory 605 before execution by the image signal processor 620.

Implementing Systems and Terminology

Implementations disclosed herein provide systems, methods and apparatus for using values received from imaging sensing elements to reduce noise of a phase detection autofocus process. One skilled in the art will recognize that these embodiments may be implemented in hardware, software, firmware, or any combination thereof.

In some embodiments, the circuits, processes, and systems discussed above may be utilized in a wireless communication device. The wireless communication device may be a kind of electronic device used to wirelessly communicate with other electronic devices. Examples of wireless communication devices include cellular telephones, smart phones, Personal Digital Assistants (PDAs), e-readers, gaming systems, music players, netbooks, wireless modems, laptop computers, tablet devices, etc.

The wireless communication device may include one or more image sensors, two or more image signal processors, a memory including instructions or modules for carrying out the process discussed above. The device may also have data, a processor loading instructions and/or data from memory, one or more communication interfaces, one or more input devices, one or more output devices such as a display device and a power source/interface. The wireless communication device may additionally include a transmitter and a receiver. The transmitter and receiver may be jointly referred to as a transceiver. The transceiver may be coupled to one or more antennas for transmitting and/or receiving wireless signals.

The wireless communication device may wirelessly connect to another electronic device (e.g., base station). A wireless communication device may alternatively be referred to as a mobile device, a mobile station, a subscriber station, a user equipment (UE), a remote station, an access terminal, a mobile terminal, a terminal, a user terminal, a subscriber unit, etc. Examples of wireless communication devices include laptop or desktop computers, cellular phones, smart phones, wireless modems, e-readers, tablet devices, gaming systems, etc. Wireless communication devices may operate in accordance with one or more industry standards such as the 3rd Generation Partnership Project (3GPP). Thus, the general term "wireless communication device" may include wireless communication devices described with varying nomenclatures according to industry standards (e.g., access terminal, user equipment (UE), remote terminal, etc.).

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It should be noted that the terms "couple," "coupling," "coupled" or other variations of the word couple as used herein may indicate either an indirect connection or a direct connection. For example, if a first component is "coupled" to a second component, the first component may be either indirectly connected to the second component or directly connected to the second component. As used herein, the term "plurality" denotes two or more. For example, a plurality of components indicates two or more components.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

In the foregoing description, specific details are given to provide a thorough understanding of the examples. However, it will be understood by one of ordinary skill in the art that the examples may be practiced without these specific details. For example, electrical components/devices may be shown in block diagrams in order not to obscure the examples in unnecessary detail. In other instances, such components, other structures and techniques may be shown in detail to further explain the examples.

The previous description of the disclosed implementations is provided to enable any person skilled in the art to make or use the present invention. Various modifications to these implementations will be readily apparent to those skilled in the art, and the generic principles defined herein may be applied to other implementations without departing from the spirit or scope of the invention. Thus, the present invention is not intended to be limited to the implementations shown herein but is to be accorded the widest scope consistent with the principles and novel features disclosed herein.

What is claimed is:

1. An imaging apparatus comprising:
   a plurality of diodes each configured to capture one of
      image information representing a target scene, the image information received from a first subset of the plurality of diodes, or
      phase detection information, the phase detection information received from a second subset of the plurality of diodes; and
   a processor configured with instructions to
      analyze the image information
      identify a region of the image information that is more in-focus than another region of the image information, and
      determine a focus value of the region,
      identify a bounding phase difference value corresponding to the focus value,
      generate at least first and second images based on the phase detection information, and
      determine a phase difference between the first and second images, and
      calculate an autofocus adjustment based at least partly on the determined phase difference and at least partly on a range defined by the bounding phase difference value.

2. The imaging apparatus of claim 1, wherein the processor is configured to determine the focus value by identifying a sharpest edge represented by the image information.

3. The imaging apparatus of claim 2, wherein the processor is configured to determine the focus value based at least partly on a sharpness value of the sharpest edge.

4. The imaging apparatus of claim 1, further comprising a masking element positioned above each of the second subset of the plurality of diodes to block a portion of light propagating from the target scene so each of the second subset of the plurality of diodes only collects the light propagating from the target scene in a specific direction.

5. The imaging apparatus of claim 1, further comprising a microlens positioned above at least two adjacent diodes of the second subset of the plurality of diodes, the microlens formed to pass a first portion of light propagating from the target scene to a first of the at least two adjacent diodes and a second portion of light propagating from the target scene to a second of the at least two adjacent diodes, the first portion propagating in a first direction and the second portion propagating in a second direction.

6. The imaging apparatus of claim 1, wherein the plurality of diodes comprise a semiconductor substrate having a two-dimensional matrix of the plurality of diodes.

7. The imaging apparatus of claim 1, wherein optical elements associated with a first half of the second subset of the plurality of diodes are configured such that each diode of the first half of the second subset of the plurality of diodes only collects light propagating from the target scene in a first direction to generate a first half of the phase detection information.

8. The imaging apparatus of claim 7, wherein optical elements associated with a second half of the second subset of the plurality of diodes are configured such that each diode of the second half of the second subset of the plurality of diodes only collects light propagating from the target scene in a second direction to generate a second half of the phase detection information.

9. A processor configured with instructions for performing a process for phase detection autofocus, the process comprising:
   accessing image information representing a target scene from a first plurality of imaging diodes;
   analyzing the image information to evaluate a focus value of at least one region;
   identifying a bounding phase difference value corresponding to the focus value;
   generating at least first and second images based on phase detection information accessed from a second plurality of imaging diodes;
   determining a phase difference between the first and second images; and
   calculating an autofocus adjustment based at least partly on the determined phase difference and at least partly on a range defined by the bounding phase difference value.

10. The processor of claim 9, wherein identifying the bounding phase difference value comprises:

determining whether the determined phase difference value falls within a range defined by the bounding phase difference value; and in response to determining that the determined phase difference value exceeds the range, outputting the bounding phase difference value as a phase difference between the first and second images.

11. The processor of claim 10, wherein outputting the bounding phase difference value as a phase difference is further performed in response to determining that the process for phase detection autofocus is in a monitoring state.

12. The processor of claim 11, wherein the monitoring state occurs after the process for phase detection autofocus has identified an in-focus condition and moved a lens assembly associated with the plurality of imaging sensing elements and the at least one phase detection sensing element to a focus position corresponding to the in-focus condition.

13. The processor of claim 9, wherein identifying the phase difference comprises analyzing the phase difference information within a range defined by the bounding phase difference value.

14. The processor of claim 9, the process for phase detection autofocus further comprising partitioning the image information into a plurality of regions and analyzing the plurality of regions to evaluate a plurality of focus values each corresponding to one of the plurality of regions.

15. The processor of claim 14, the process for phase detection autofocus further comprising identifying a plurality of bounding phase differences value each based on one of the plurality of focus values.

16. The processor of claim 15, the process for phase detection autofocus further comprising combining the plurality of bounding phase difference values to produce the bounding phase difference value used for calculating the autofocus adjustment.

17. The processor of claim 15, the process for phase detection autofocus further comprising selecting one of the plurality of bounding phase difference values of at least some of the plurality of regions to output as the bounding phase difference value used for calculating the autofocus adjustment.

18. A process for phase detection autofocus comprising:
accessing image information from a plurality of imaging diodes, the image information representing a target scene;
accessing phase detection information received from a plurality of phase detection diodes;
determining, based on the image information, information representing at least one depth discontinuity in the target scene;
identifying a pair of the plurality of phase detection diodes located on opposing sides of the at least one depth discontinuity; and
calculating an autofocus adjustment based on phase detection information received from a subset of the plurality of phase detection diodes excluding the pair.

19. The process of claim 18, wherein determining the information representing the at least one depth discontinuity in the target scene comprises:
interpolating, from the image information, a first center pixel value at a location of a first phase detection diode in the pair and a second center pixel value at a location of a second phase detection diode in the pair;
calculating a first disparity value between the first center pixel value and a value received from the first phase detection diode;

calculating a second disparity value between the second center pixel value and a value received from the second phase detection diode; and
comparing a difference between the first disparity and the second disparity to a threshold.

20. The process of claim 19, further comprising excluding the pair from the subset of the plurality of phase detection diodes in response to determining that the difference is greater than the threshold.

21. The process of claim 19, wherein interpolating the first center pixel value comprises accessing image information received from a 5×5 neighborhood of the plurality of imaging diodes around a location of the first phase detection diode.

22. The process of claim 19, further comprising computing the difference between the first disparity and the second disparity.

23. The process of claim 18, wherein determining the information representing the at least one depth discontinuity in the target scene comprises performing edge detection on the image information.

24. The process of claim 18, wherein calculating an autofocus adjustment comprises:
using phase detection information received from the subset of the plurality of phase detection diodes to generate a pair of half-images;
determining a phase difference between the half-images; and
calculating the autofocus adjustment based on the phase difference.

25. An imaging apparatus comprising:
means for capturing image information representing a target scene;
a plurality of means for capturing phase detection information;
means for identifying a region of the image information that is more in-focus than another region of the image information and determining a focus value of the region;
means for identifying a bounding phase difference value corresponding to the focus value;
means for generating at least first and second images based on the phase detection information;
means for determining a phase difference between the first and second images, and
means for calculating an autofocus adjustment based at least partly on the determined phase difference and at least partly on a range defined by the bounding phase difference value.

26. The imaging apparatus of claim 25, further comprising means for partitioning the image information into a plurality of regions, wherein the means for identifying the bounding phase difference value is configured to identify a plurality of bounding phase difference values each corresponding to one of the plurality of regions.

27. The imaging apparatus of claim 26, further comprising means for combining the plurality of bounding phase difference values of at least some of the plurality of regions to produce the bounding phase difference value used for calculating the autofocus adjustment.

28. The imaging apparatus of claim 26, further comprising means for selecting one of the plurality of bounding phase difference values of at least some of the plurality of regions to output as the bounding phase difference value used for calculating the autofocus adjustment.

29. The imaging apparatus of claim 25, wherein the means for generating at least first and second images based on the phase detection information comprises an image sensor including logic.

30. The imaging apparatus of claim 25, wherein the means for generating at least first and second images based on the phase detection information comprises an image signal processor.

* * * * *